United States Patent [19]
Abramov et al.

[11] Patent Number: 5,150,371
[45] Date of Patent: Sep. 22, 1992

[54] LASER DIODE CARRIER WITH A SEMICONDUCTOR COOLER

[75] Inventors: Igor Abramov; Steven A. Buhler, both of Redondo Beach; Parviz P. Mazdiyasni, Brea, all of Calif.

[73] Assignee: Xerox Corporation, Stamford, Conn.

[21] Appl. No.: 710,599

[22] Filed: Jun. 5, 1991

[51] Int. Cl.$^5$ .............................................. H01S 3/04
[52] U.S. Cl. ......................................... 372/34; 372/36; 372/50
[58] Field of Search .............................. 372/34, 36, 50

[56] References Cited

U.S. PATENT DOCUMENTS

| | | | |
|---|---|---|---|
| 2,984,077 | 5/1961 | Gaskill | 62/3 |
| 4,238,759 | 12/1980 | Hunsperger | 357/28 |
| 4,571,728 | 2/1986 | Yoshikawa | 372/36 |
| 4,661,959 | 4/1987 | Kaneko | 372/34 |
| 4,685,081 | 8/1987 | Richman | 365/1 |
| 4,727,554 | 2/1988 | Watanabe | 372/34 |
| 4,737,798 | 4/1988 | Lonis | 346/1.1 |
| 4,809,291 | 2/1989 | Byer | 372/75 |
| 5,084,886 | 1/1992 | Martin | 372/36 |

FOREIGN PATENT DOCUMENTS 0204292 11/1984 Japan ................................ 372/34

Primary Examiner—Georgia Y. Epps

[57] ABSTRACT

A new and improved flip chip combination of a laser diode chip and a carrier chip with built-in thermoelectric cooler. This invention comprises an array of laser stripes, each having a separate cooling strip bonded to it. Each cooling strip could be controlled either separately or by a common source, permitting cooling of each laser stripe at a different rate or at the same rate respectively, to thereby maintain the laser stripes at the same or different operating temperatures.

6 Claims, 7 Drawing Sheets

LASER DIODE CARRIER WITH A SEMICONDUCTOR COOLER

BACKGROUND OF THE INVENTION

Lately, there has been interest in fabricating laser diodes with several lasing stripes located on the same substrate. Because the semiconductor material used in laser diode manufacture is quite expensive, the lasing stripes usually share common electrical contacts in order to save space. Thus they have to operate simultaneously.

It is desirable, however, to operate the individual laser stripes independently of each other. For this purpose, the electrical contacts on the laser chip are delineated to correspond to individual laser stripes, and the whole chip is then bonded face-down on a carrier, which is made of a less expensive material, such as silicon. This is known in the art as 'flip-chip' bonding.

The carrier, which is considerably larger than the laser chip, has a metal pattern mimicking the contact pattern of the laser stripes, and a set of bonding pads connected to the individual contacts. By applying electrical signals to the pads of the carrier, the laser stripes are made to operate independently of each other.

Generally, to control the light output of laser diodes, electronic feedback systems are utilized, which sense the laser's light output and adjust the drive current in such a way as to keep the light output constant and usually equal to some pre-set value. Some laser diode applications also require emission of light of precise wavelength. For this purpose, as well as heat removal in general, the laser diodes are mounted on thermoelectric cooler modules.

These modules are much larger than the laser diodes themselves, and often the laser is mounted on the module, rather than vice-versa. Furthermore, these modules are assembled of a large number of individual components, which makes them rather expensive.

The problems arise when the output of each laser stripe has to match the output of any other on the chip. The laser diodes in general, and the laser stripes in particular, heat up while being electrically driven during their operation. With time, their electro-optical characteristics also change.

For instance the so-called threshold current, which is the drive current at which lasing operation of the diode commences, tends to increase with age and also with temperature.

Also, due to manufacturing process variations, the individual laser diodes, even taken from the same substrate wafer, may have different electro-optical characteristics, such as efficiency (i.e. how much light is generated with a given drive current), and already mentioned threshold current.

In addition, the output wavelength of a laser stripe is affected by its temperature, which, in turn, depends on that stripe's drive current.

Without cooling, different drive currents will induce different temperature in the laser stripes, which will cause a shift both in their electrical characteristics, and also in the wavelength of the light each of them emits. Even addition of a common cooler does not solve this problem, as some of the stripes may be over-cooled, while others will remain relatively hot for their optimal operation.

The purpose of this invention is, therefore, to provide each laser stripe with its own cooling source to control its electrical and optical characteristics.

Another purpose of this invention is to provide a compact and inexpensive cooling module for laser diodes in general, whereby the module is incorporated, preferably along with its controlling circuitry, on the laser diode carrier.

Further advantages of the invention will become apparent as the following description proceeds.

SUMMARY OF THE INVENTION

A flip chip combination of a laser diode chip and a thermoelectric cooler in which the laser diode chip comprises a plurality of laser stripes and associated electrodes, the cooler chip comprises a plurality of cooling strips. The laser chip and the cooler chip are attached to each other in a manner that each cooling strip is substantially aligned with and thermally connected to a respective laser stripe to cool its respective laser stripe. Each cooling strip could be controlled either separately or by a common source, whereby cooling each laser stripe at a different rate or at the same rate respectively.

DESCRIPTION OF THE INVENTION

Figure 1:
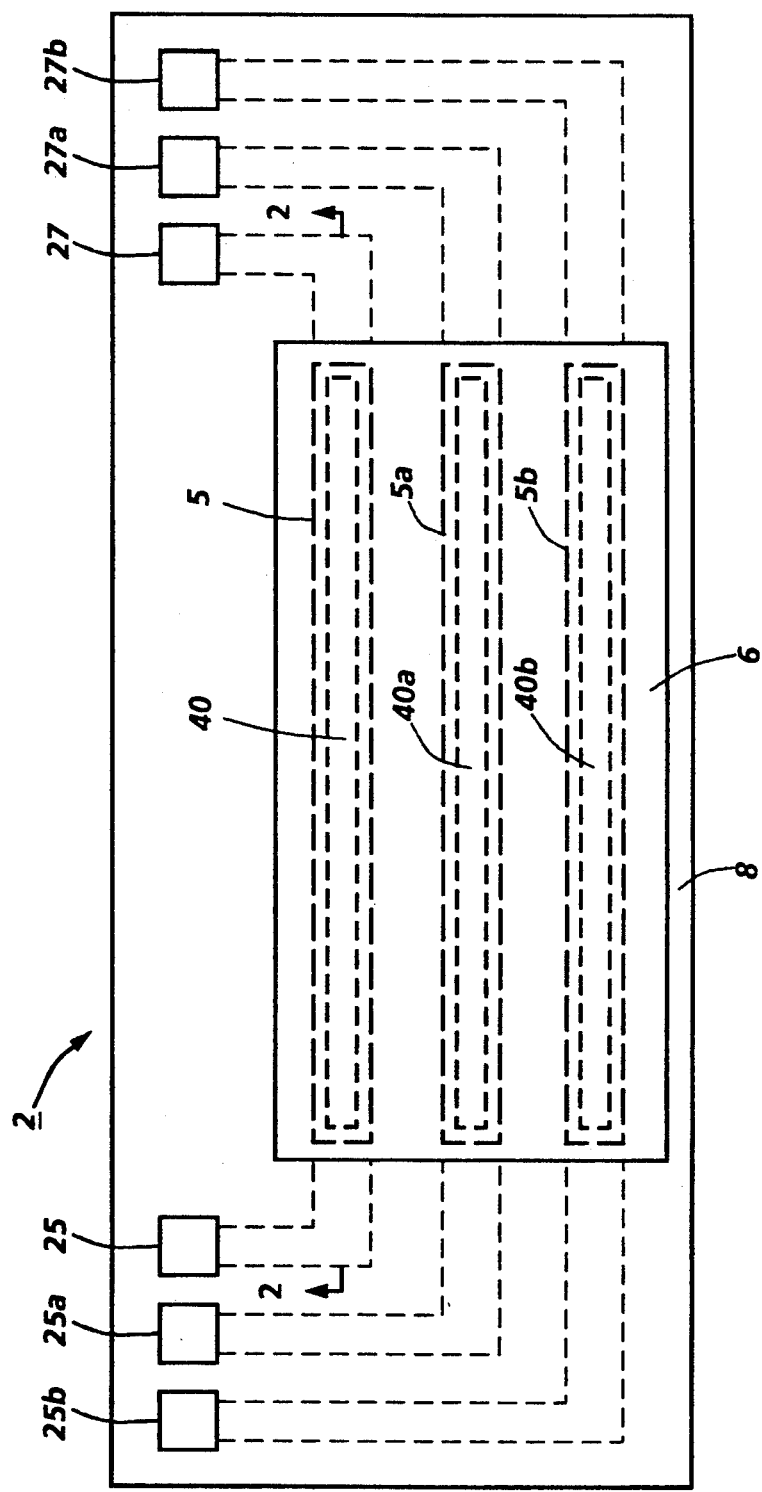
FIG. 1 is a top view of a laser diode and a thermoelectric cooler assembly.

Referring to FIG. 1, there is shown an assembly of a laser diode chip 6 and a carrier with a thermoelectric cooling chip 8 of this invention 2. The laser diode 6 has a plurality of laser stripes 40, 40a and 40b terminated on a surface of the chip with metallic electrodes 41, 41a and 41b (see FIG. 3) which essentially follow the shape of the laser stripes. The thermoelectric cooling chip 8 has a plurality of cooling strips 5, 5a and 5b and plurality of electrical contacts 25, 25a 25b, 27, 27a and 27b. It should be noted that any semiconductor thermoelectric cooling device processed in strips could be used in this invention. The semiconductor cooling device of this embodiment has been disclosed in U.S. patent application (D/90307) titled "Thermoelectric Device" filed concurrently herewith (common assignee).

Figure 2:
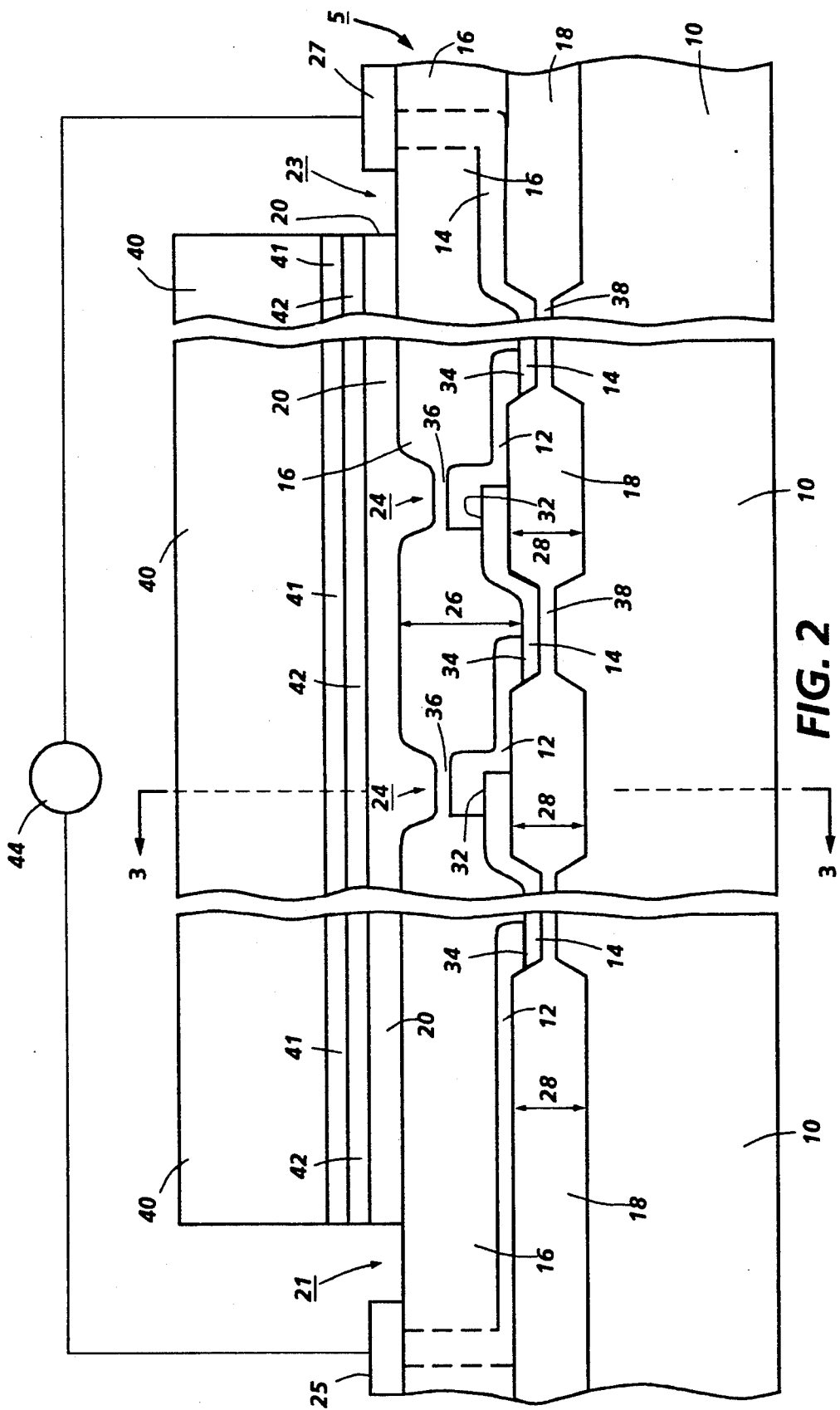
FIG. 2 is a view taken along the section line 2—2 in FIG. 1.

FIG. 2 shows a cross section of a cooling strip 5 bonded, preferably via soldering process, to a laser electrode 41. Each cooling strip 5 comprises an array of thermocouples, which are composed of strips of two electric conductor materials of different thermoelectric properties such as tantalum 12 and polysilicon 14 connected to each other in series. One end of each tantalum strip 12 is connected to one end of a polysilicon strip 14 forming one of the cold junctions 32 of the thermocouples. The other end of the same tantalum strip 12 is connected to the end of a different polysilicon strip 14 to form one of the hot junctions 34 of the thermocouples.

The thermocouples are buried between a first layer of oxide 18 at the bottom and a second layer of oxide 16 at the top. The first and second are referred to the oxide layers based on priority of the process steps. A layer of metal 20, which in this embodiment is aluminum, covers the second layer of oxide 16.

The aluminum layer 20 has a plurality of heat transferring locations 24 which are located above the cold junctions 32. This layer 20 is etched and removed at two areas 21 and 23 to provide two isolated pieces of electrical contacts 25 and 27 for electrical connections. Preferably one tantalum segment 12 from one of the endmost thermocouples of the series and one polysilicon segment 14 from one of the other endmost thermocouples of the series are extended to have electrical contacts with the electrical contacts 25 and 27 for electrical continuity.

The first layer of oxide 18, which is located between the thermocouples and the substrate 10, has thin portions 38 and thick portions 28 formed by standard semiconductor processing techniques. The thin portions 38 are located between hot junctions 34 and the substrate 10 to provide a passage for the heat to be transferred from the hot junctions 34 to the substrate 10. The thick portions 28 are located between cold junctions 32 and the substrate 10 to prevent the heat transfer from the substrate 10 to the cold junctions 32.

The second layer of oxide 16, which is located between the thermocouples and the aluminum layer 20, also has thin portions 36 and thick portions 26 formed by standard semiconductor processing techniques. The thin portions 36 are located between heat transferring locations 24 and cold junctions 32 to provide a passage for the heat to be transferred from the aluminum layer 20 to the cold junctions 32. The thick portions 26 are located between hot junctions 34 and the aluminum layer 20 to prevent the heat transfer from the aluminum layer 20 to the hot junctions 34.

The cooling strip 5 is preferably soldered with a layer of suitable solder 42 to a laser electrode 41. Since aluminum cannot be readily soldered to other metals, it may be necessary to provide intermediate metallization layer or layers between the aluminum layer 20 and solder layer 42 in order to facilitate their mutual adhesion and bonding. For example, such layer or layers can be nickel or zinc deposited via electro- or electro-less plating process. These layers can serve as intermediaries only and do not appreciably affect either laser chip bonding operation or thermal performance of the assembly. Thus these layers are not shown in the Figures.

Furthermore, if other types of bonding are selected for laser chip to carrier attachment, the intermediary layers and the solder layer itself may become unnecessary. For instance, if ultrasonic bonding is used, the aluminum on the cooling strips can bond readily with metal electrodes on the laser chip, provided they are made of a suitable material themselves.

The solder 42 provides thermal and electrical contacts between the laser electrode 41 and the aluminum layer 20. The laser electrode 41 can be connected to a power supply (not shown) either independently or through the aluminum layer 20. If the latter connection is used, a voltage source will be connected to the aluminum layer 20 directly. In this case, the aluminum layer 20 not only cools the laser stripe it also supplies electrical power to the laser chip. This type of construction allows the set of two chips to be placed in one package using electrical contacts 25, 27 and the other associated contacts for only the cooler chip.

In operation, the laser stripe 40 heats up the aluminum layer 20 through the laser electrode 41 and the layer of solder 42. The thick portions 26 of the oxide prevent the heat in the aluminum layer 20 from penetrating through the Oxide layer. Therefore, the heat in the aluminum layer 20 moves to the heat transferring locations 24 which are above the thin portions 36 of the oxide layer. The heat transferring locations 24 concentrate the heat through the thin portions 36 of the oxide onto the cold junctions 32.

Based on Peltier effect, if an electric current flows in the same direction as the current at the cold junctions 32 in a thermoelectric circuit of two metals, heat is absorbed. Therefore, the cold junctions 32 absorb the heat from the heat transferring locations 24 through the thin portions 36 of the second layer of the oxide 16. This process cools the aluminum layer 20 and the adjacent area to the aluminum, therefore cooling the laser stripe 40. By adjusting the electric current flow, the aluminum layer 20 and the laser stripe 40 can be cooled to a desired temperature.

The absorbed heat by the cold junctions 32 is transferred to the hot junctions 34 where it is dissipated. The flow of an electric current at the hot junctions 34 in the same direction as the current in a thermoelectric circuit of two metals, will cause the hot junctions to liberate the heat. Passing through the thin portions 38 of the oxide, the heat from the hot junctions dissipates into the silicon substrate 10. The thick portions 28 of the oxide prevent the heat from the substrate 10 from affecting the cold junctions 32.

Also, because the thermal masses of the laser electrode 41 and the thermoelectric cooler strip 5 are small, and the thermal resistance of the thin portions 36 of the second layer of oxide is low, the temperature of the laser stripe 40 can be changed very fast (dynamically). This can be beneficial for dynamic control of the output wavelength of a laser stripe (which depends on the temperature).

Figure 3:
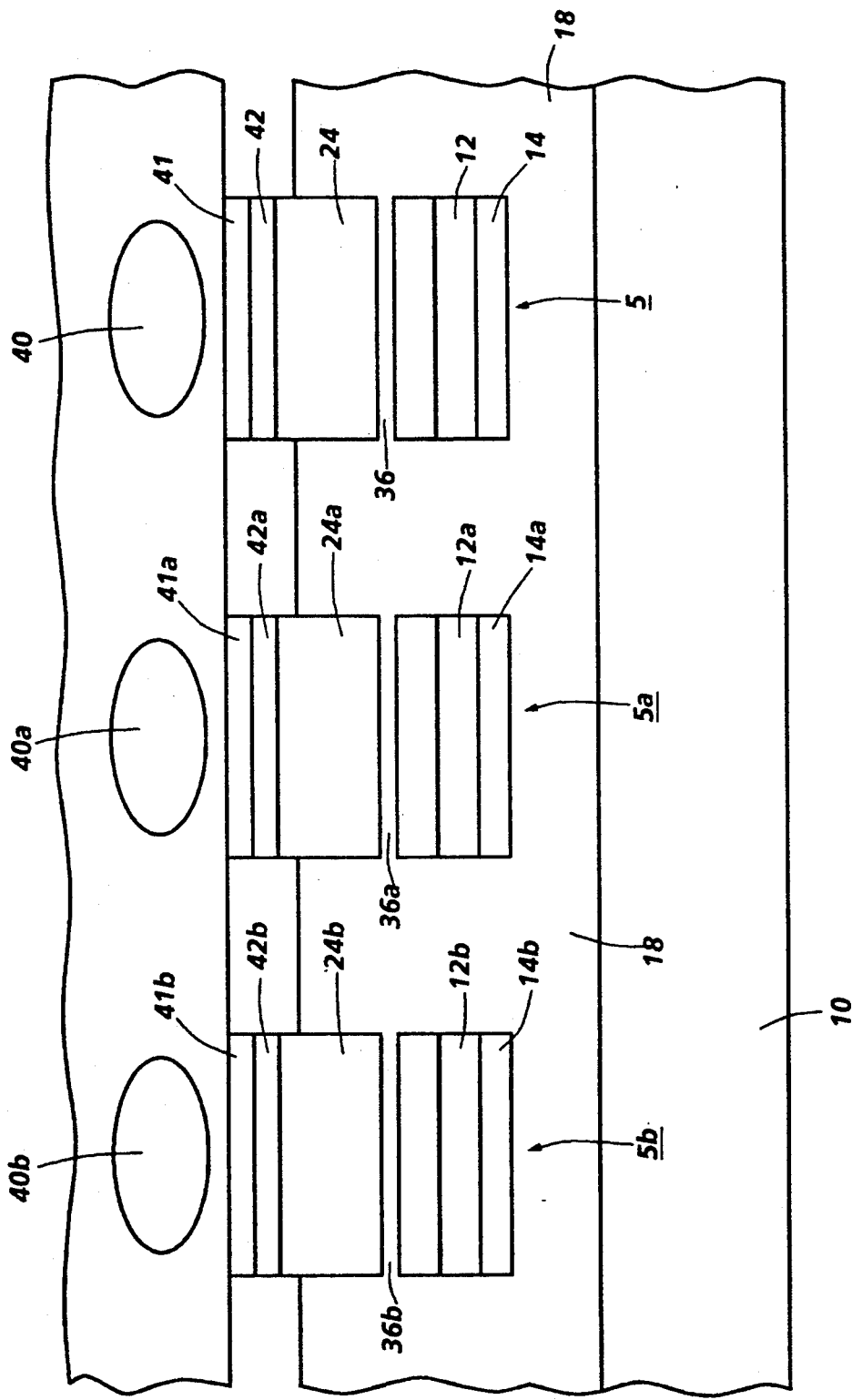
FIG. 3 is a view taken along the section line 3—3 in FIG. 2.

The thermoelectric cooler described in this embodiment can be processed in plurality of strips on one silicon chip. The distance between the cooling strips could be designed to have the same distance as the distance between the laser stripes, whereby each cooling strip is aligned with a respective laser stripe. FIG. 3 shows an assembly of a laser diode chip and thermoelectric cooling chip, whereby a plurality of laser stripes 40, 40a and 40b with associated laser electrodes 41, 41a and 41b are aligned and soldered by respective layers of solder 42, 42a and 42b to a plurality of cooling strips 5, 5a and 5b. The first oxide layer 18 separates the cooling strips 5, 5a and 5b from the substrate 10 and also extends between the cooling strips 5, 5a and 5b. The cooling strip 5 comprises a tantalum stripe 12, a polysilicon stripe 14, a thin portion 36 of the second oxide layer 16 and a heat transferring location 24 of the aluminum layer 20. The elements 24a, 24b, 36a, 36b, 12a, 12b, 14a and 14b are the same elements as described for 24, 36, 12 and 14 respectively.

Figure 4:
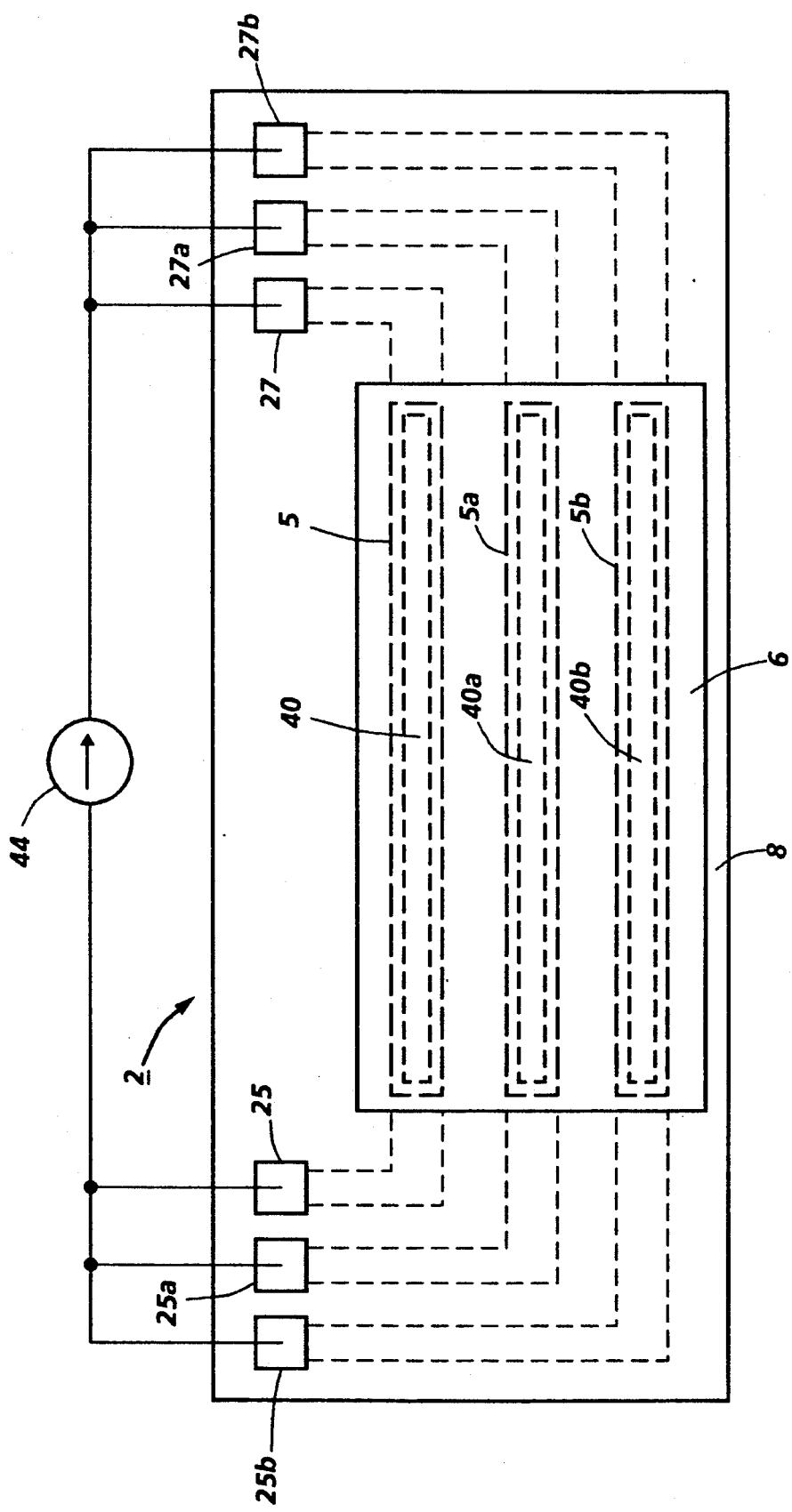
FIG. 4 is a top view similar to FIG. 1 only modified wherein there is one current source for the thermoelectric cooler.

Having separate cooling strips for each laser stripe provides the option of cooling all the laser stripes at the same rate or cooling each laser stripe at a different rate to a common temperature. Referring to FIG. 4, all the laser stripes can be cooled at the same rate by connecting the cooling strips 5, 5a, and 5b directly to one current source 44. The connection of current source 44 to each cooling strip is done through the respective electrical contacts 25, 25a, 25b, 27, 27a and 27b. In this case, all the cooling strips receive the same amount of current flow which in turn cool all the laser stripes at the same rate.

However, if each laser stripe is cooled at a different rate, then all the stripes could be cooled to a common temperature between the laser stripes. This solves the problem of inconsistency between the wavelength of light generated by each laser stripe. Variation of electro-optical characteristics in each laser stripe causes a difference in temperature between the laser stripes when the laser stripes are used. This variation in temperature affects the wavelength of the light generated by the laser stripes. By cooling each laser stripe to the common temperature between the laser stripes, they all can produce the same wavelength which is critical for some applications. Conversely, by controlling the temperature of each laser stripe, one can shift its wavelength which can be advantageous for certain applications utilizing different wavelengths.

Figure 5:
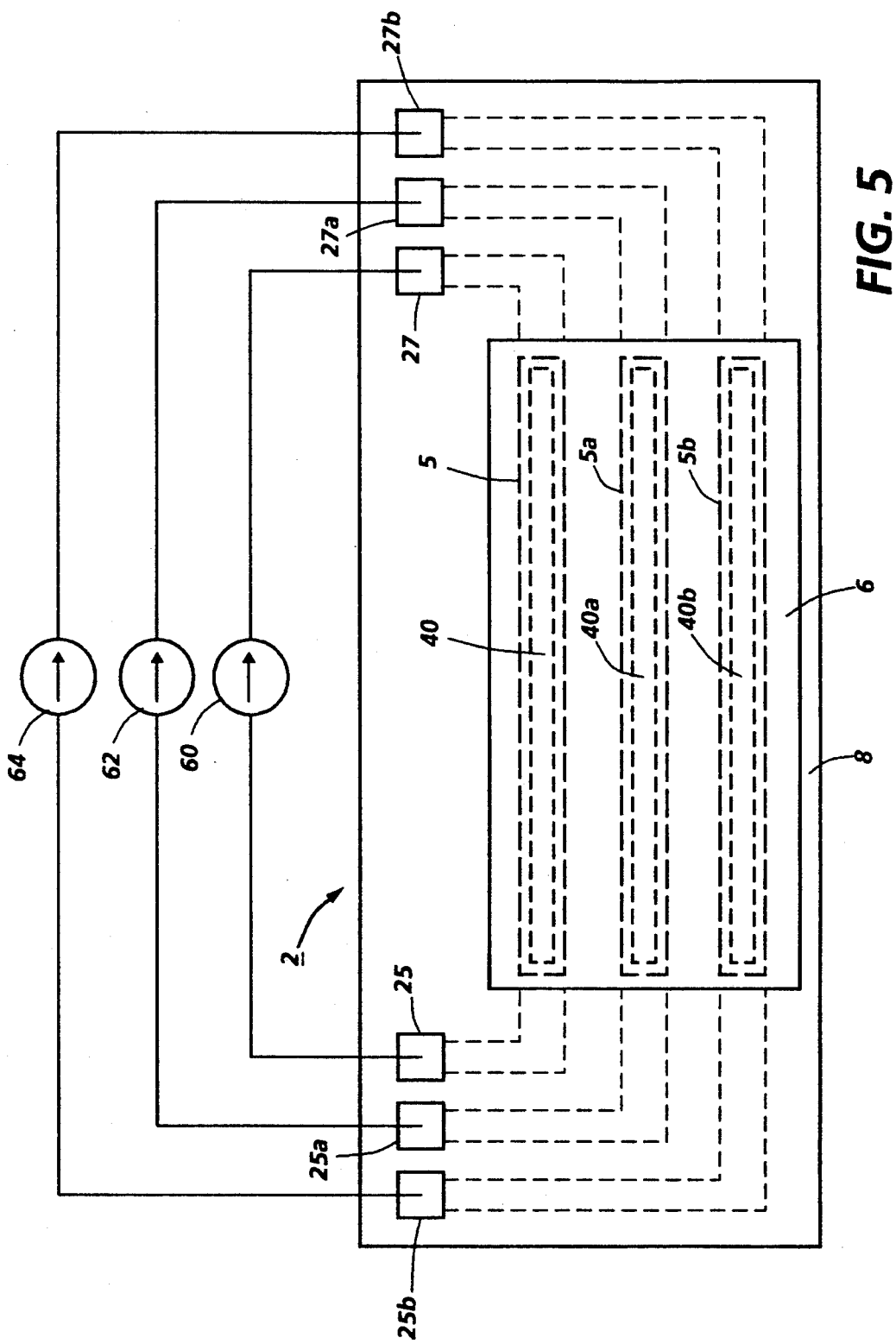
FIG. 5 is a top view similar to FIG. 1 only modified wherein there are separate current sources for the thermoelectric cooler.

Cooling each laser stripe at a different rate can be achieved by supplying a different current flow to each cooling strip which can be done in several different ways. One alternative, as shown on FIG. 5, is to connect the cooling strips 5, 5a, and 5b to separate current sources 60, 62 and 64 through the electrical contacts 25, 25a, 25b, 27, 27a and 27b. As shown on FIG. 6, a second alternative would be to connect the cooling strips 5, 5a, and 5b via electrical contacts 25, 25a, 25b, 27, 27a and 27b and through different current adjusting elements such as variable resistors 62, 64 and 66 to a common current source 68 to receive different electric current flow.

Having a separate cooling strip for each laser stripe also improves the power dissipation of the laser diode chip. Therefore, for a given light output, by utilizing active cooling one can supply a lower drive current to the laser stripes, than required otherwise. This could be accomplished by connecting a temperature control system 74, as shown on FIG. 7, to a current adjusting element 72 for controlling the same. The current adjusting element 72, which is connected to a current source 70, adjusts the current flow of the respective cooling strip 5. The temperature control system 74 accepts input from a temperature sensor 76 located in the vicinity of the laser stripe, along with input from a light sensor 78 and optionally from a laser stripe output controller 80. Based on individual inputs from each of the sensors 76 and 78, or the output of the controller 80, or combination thereof the system 74 controls the current adjusting element 72 to obtain an optimum current for cooling strip 5. This leads to relaxed demands on the drive circuitry of the laser stripe (not shown) and lengthens the life of the laser diode chip.

Figure 6:
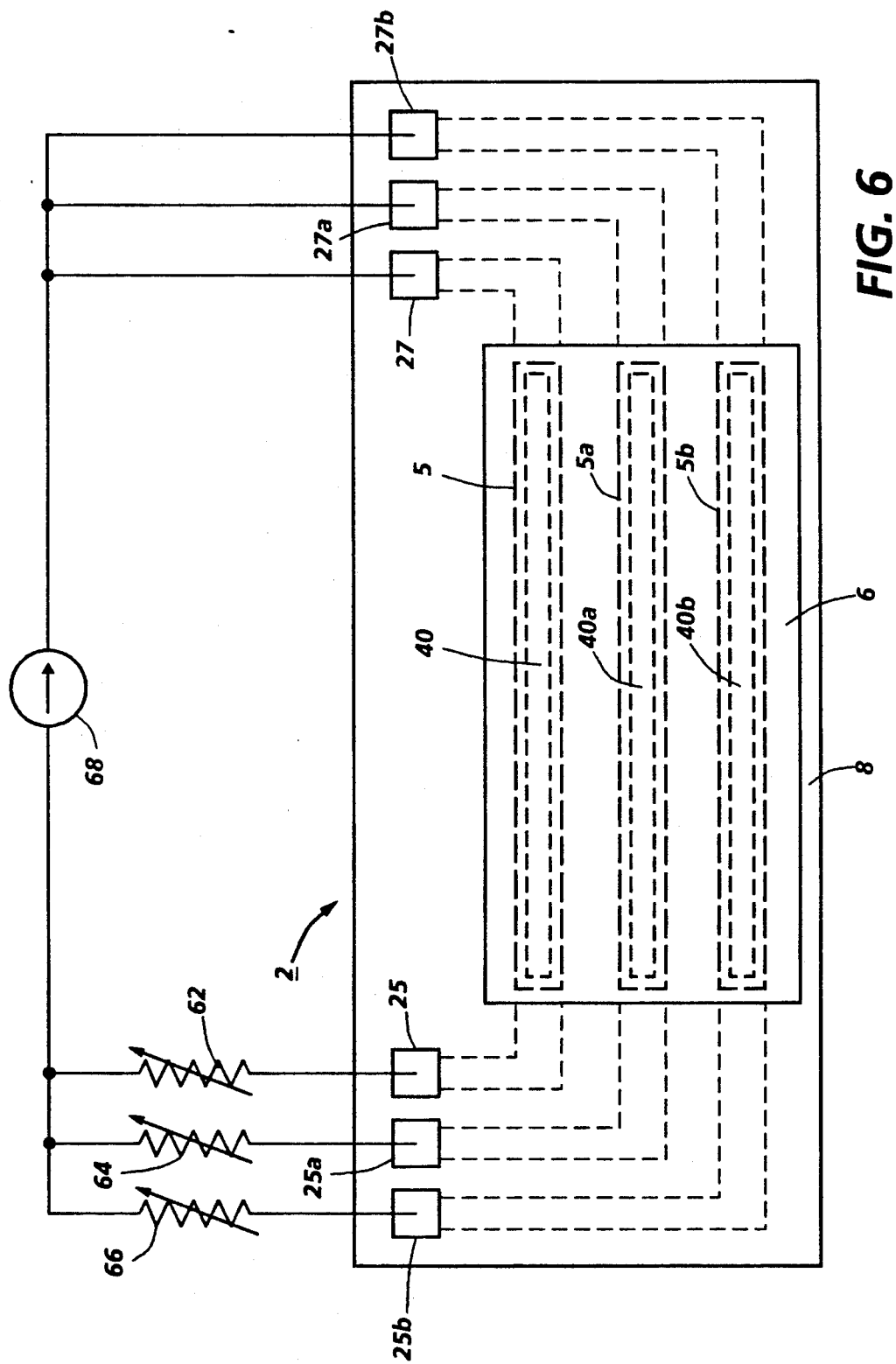
FIG. 6 is a top view similar to FIG. 1 only modified wherein there is one current source and separate current adjusting elements for each cooling strip of the thermoelectric cooler.
Figure 7:
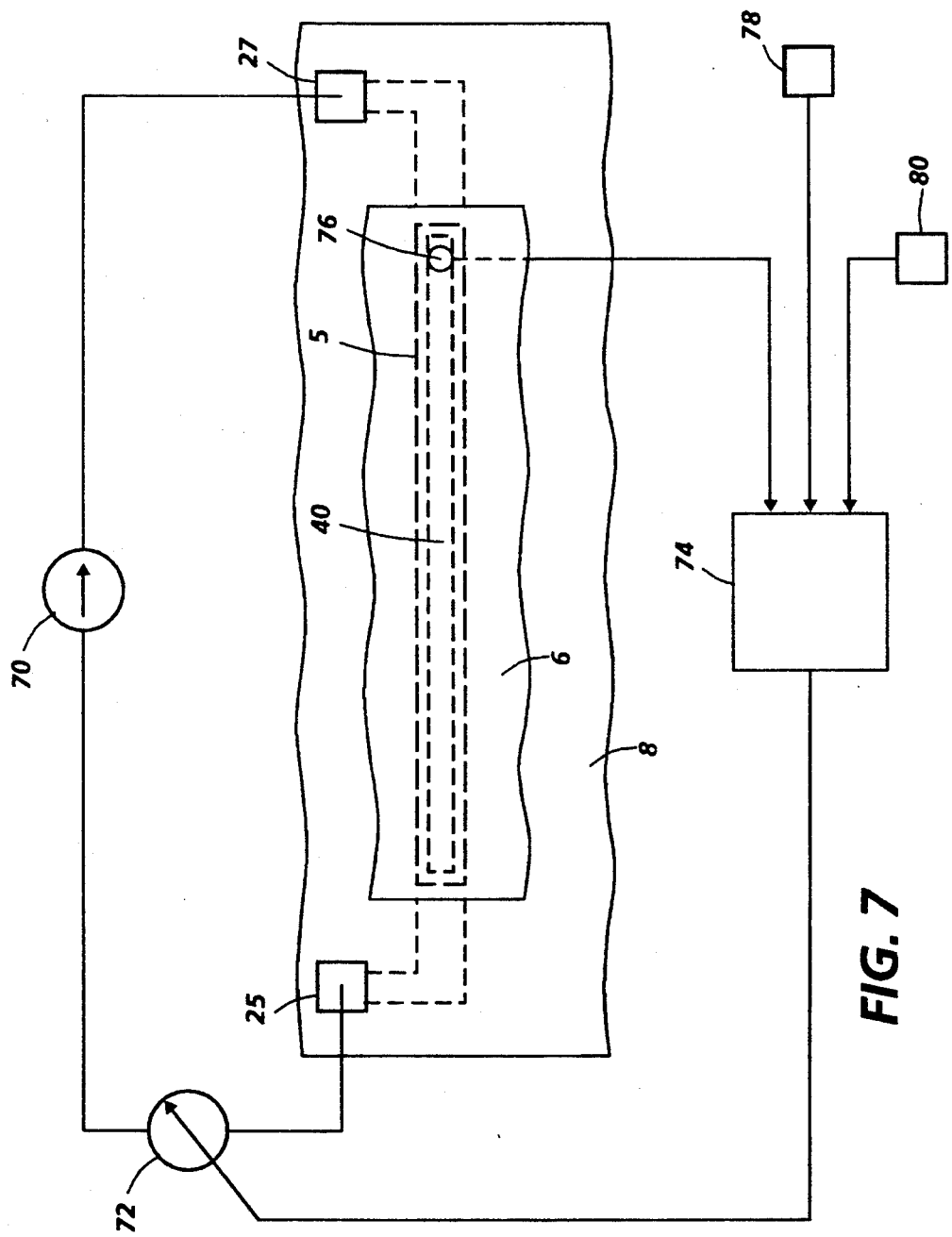
FIG. 7 is a top view of a laser stripe and a cooler strip assembly including a controller for the embodiment of FIG. 6.

It should be understood that the embodiment of FIG. 7 can be applied to the embodiment of FIG. 6, whereby each one of the current adjusting elements 62, 64 and 66 can be connected to a separate temperature control system (not shown) with associated controlling and sensing elements. Also, all of the controlling and sensing elements disclosed in the embodiment of FIG. 7 can be optionally incorporated on the carrier chip.

What is claimed is:

1. A flip chip combination of a laser diode chip and a thermoelectric cooler chip, comprising:
   said laser diode chip comprising a plurality of laser stripes;
   said cooler chip comprising a plurality of cooling strips; and
   said laser chip and said cooler chip being attached to each other in a manner that each of said laser stripes is substantially aligned with and operably connected to a respective cooling strip so that each cooling strip cools its respective laser stripe.

2. The flip chip combination of a laser diode chip and a thermoelectric cooler chip as recited in claim 1, further comprising:
   a plurality of current sources; and
   each of said current sources being operably connected to a respective one of said cooler strips for cooling a respective one of said laser stripes.

3. The flip chip combination of a laser diode chip and a thermoelectric cooler chip as recited in claim 1, further comprising:
   a current source;
   a plurality of current adjusting means;
   each of said current adjusting means being operably connected to a respective one of said cooling strips;
   said current source being connected to each of said current adjusting means;
   control means connected to each of said current adjusting means; and
   said current adjusting means adjusting the current from said current source in response to an input from said control means.

4. The flip chip combination of a laser diode chip and a thermoelectric cooler chip as recited in claim 3, wherein a separate control means is provided for each of said current adjusting means.

5. The flip chip combination of a laser diode chip and a thermoelectric cooler chip as recited in claim 3, wherein said current adjusting means is a variable resistor.

6. The flip chip combination of a laser diode chip and a thermoelectric cooler chip as recited in claim 1, further comprising:
   a current source; and
   said current source being operably connected to each of said cooling strips for cooling said laser stripes.

* * * * *